US008560101B2

(12) United States Patent  (10) Patent No.: US 8,560,101 B2
Iwata  (45) Date of Patent: Oct. 15, 2013

(54) AUDIO SIGNAL PROCESSING APPARATUS AND AUDIO SIGNAL PROCESSING METHOD

(75) Inventor: Kazuya Iwata, Osaka (JP)

(73) Assignee: Panasonic Corporation, Osaka (JP)

( * ) Notice: Subject to any disclaimer, the term of this patent is extended or adjusted under 35 U.S.C. 154(b) by 392 days.

(21) Appl. No.: 12/894,823

(22) Filed: Sep. 30, 2010

(65) Prior Publication Data

US 2011/0144781 A1    Jun. 16, 2011

(30) Foreign Application Priority Data

Oct. 1, 2009   (JP) ................................. 2009-229429

(51) Int. Cl.
*G06F 17/00*    (2006.01)
(52) U.S. Cl.
USPC .......................................................... 700/94
(58) Field of Classification Search
USPC ..................................... 700/94; 704/500–504
See application file for complete search history.

(56) References Cited

U.S. PATENT DOCUMENTS

| 5,493,297 | A | * | 2/1996 | Nguyen et al. ................ 341/118 |
| 5,714,951 | A | | 2/1998 | Masamichi |
| 5,852,566 | A | | 12/1998 | Iwata |
| 6,915,319 | B1 | * | 7/2005 | Sato ............................. 708/313 |
| 2009/0043201 | A1 | | 2/2009 | Tanigawa et al. |

FOREIGN PATENT DOCUMENTS

| JP | 07-248797 | 9/1995 |
| JP | 09-098092 | 4/1997 |
| JP | 10-242859 | 9/1998 |
| JP | 11-261422 | 9/1999 |
| JP | 2004-180017 | 6/2004 |
| JP | 2008-072280 | 3/2008 |

* cited by examiner

*Primary Examiner* — Andrew C Flanders
(74) *Attorney, Agent, or Firm* — Wenderoth, Lind & Ponack, L.L.P.

(57) ABSTRACT

Audio signal processing apparatus includes: an amplitude change extractor 3 which obtains an amplitude change extraction signal which is a signal having an amplitude changing at a fixed quantization width when an amplitude of an input signal temporally changes; a first requantizer 2 which extends, from a first bit count to a second bit count, a bit count representing the amplitude change extraction signal obtained; a second requantizer 5 which smoothes the amplitude change extraction signal by requantizing using a second quantization width less than a first quantization width used on the input signal; a difference signal generator which obtains a difference signal which is a signal represented using the second bit count and obtained by subtracting the amplitude change extraction signal from the input signal; and an adder 6 which generates an output signal by adding a second requantized signal which is the amplitude change extraction signal smoothed by the second requantizer 5 and the difference signal obtained by the difference signal generator 4.

2 Claims, 12 Drawing Sheets

● Amplitude change extraction signal
○ Second requantized signal

● Amplitude change extraction signal
○ Second requantized signal

- ● Amplitude change extraction signal
- ▲ Data inserted in previous-value holding process
- △ Result of weighted average processing of 5 samples
- ○ Output signal of second requantizer 5

AUDIO SIGNAL PROCESSING APPARATUS AND AUDIO SIGNAL PROCESSING METHOD

BACKGROUND OF THE INVENTION (1) Field of the Invention

The present invention relates to digital audio technology for converting an analog signal to a digital signal and recording and reproducing the digital signal, and particularly relates to bit extension technology for recreating amplitude information lost due to quantization during digitalization of an analog signal.

(2) Description of the Related Art

Digital audio technology for digitalizing an analog music signal and recoding and reproducing the digital signal is the current is predominant audio technology because digital audio technology provides extremely high signal recreatability, digital signal processing facilitates LSI-implementation, and implementation through small-sized and power-saving configurations is possible at an inexpensive price.

However, since quantization and sampling processes are performed with predetermined values for the quantization bit number and the sampling frequency in the conversion of analog signals to digital signals, it is not possible to recreate minute signals that are below the resolution capability. Furthermore, it is likewise not possible to accurately quantize a low-frequency signal, even when it is a signal having large amplitude, because the change in amplitude is small in terms of sampling interval. As such, recreatability of minute signals deteriorates. Furthermore, there are disadvantages in terms of sound quality, such as the gradation of low frequency signals becoming unclear.

Consequently, there has been conventionally proposed a bit extension technique of performing prediction and filtering processes on an audio signal having a quantization error, converting such audio signal into a signal having a larger quantization bit number than the original digital audio signal, and thus reducing quantization noise.

For example, a technique of extending the bit count of an input signal by N bits by multiplying the value representing the input signal by $2^N$, then applying a low-pass filter to the bit-extended signal is commonly performed. With this, the values of the bit-extended input signal are smoothly interpolated. However, there is the problem that the high-frequency component of a signal is lost due to low-pass computation.

FIG. 13 is a diagram showing an example of a conventional quantization distortion reducing apparatus.

Hereinafter, an operation of the conventional quantization distortion reducing apparatus shall be described with reference to FIG. 13.

In FIG. 13, digital low-pass filters 103 to 105 extract low-frequency components equal to or lower than a predetermined cut-off frequency from an input digital signal D0 while extending the bit length in the lowest-bit direction. Meanwhile, a counter 102 counts, for each point of the input digital signal D0, the number of points in which the same value continues before and after such point. Subsequently, based on the counting result from the counter 102, a selection unit 106 (i) selects and outputs, for a section having a count value lower than a predetermined value, a digital signal D1 which has been time-adjusted and has had its bit length extended in the lowest-bit direction by a delayer 108 and a bit extension circuit 109, respectively, out of the input digital signal D0, and (ii) selects and outputs, for a section having a count value equal to or greater than the predetermined value, a signal that is selectively passed through a filter having a lower cut-off frequency among the digital low-pass filters 103 to 105 as the count value is larger, thereby extending the quantization bit number. With this, it is possible to select a filter having a low cut-off frequency when there are many points where the same value continues before and after, that is, when the frequency is low, and select a filter having a high cut-off frequency when there are few points where the same value continues before and after, that is, when the frequency is high (see Patent Reference 1).

CITATION LIST

[Patent Reference 1] Japanese Unexamined Patent Application Publication No. 9-98092

SUMMARY OF THE INVENTION

However, with the conventional technique, the number of digital data where the same value continues is detected using a counter, and a low-pass filter which allows continuous data to change smoothly is applied according to such count value, and thus there is the problem that several low-pass filters having different cutoff characteristics need to be provided and thus increasing the processing scale.

Furthermore, since the number of low-pass filters that can be provided in terms of configuration is limited (a few types), there is the problem that the most appropriate processing for many types of signals cannot be performed.

The present invention is conceived to solve the problems possessed by the conventional techniques and has as an object to provide an audio signal processing apparatus which can perform the most appropriate processing and extend the quantization bit number for many types of signals, and which can implement the extension of the quantization bit number without causing the increase in processing scale brought about by providing several low-pass filters for such purpose.

In order to solve the aforementioned problems, the audio signal processing apparatus according to the present invention includes: a change obtainment unit configured to obtain a change signal which is a signal having an amplitude that changes at a fixed quantization width when an amplitude of an input signal temporally changes; a quantization unit configured to extend, from a first bit count to a second bit count, a bit count for representing the change signal obtained by the change obtainment unit, and to smooth the change signal by requantizing the change signal using a second quantization width that is less than a first quantization width used on the input signal; a difference signal obtainment unit configured to obtain a difference signal which is a signal represented using the second bit count and obtained by subtracting the change signal obtained by the change obtainment unit from the input signal; and a generation unit configured to generate an output signal by adding the change signal smoothed by the quantization unit and the difference signal obtained by the difference signal obtainment unit.

With this, the audio signal processing apparatus according to an aspect of the present invention can, with a simple configuration, extend the bit width of the input signal.

Here, the change obtainment unit may be further configured to obtain the change signal by detecting a change of the input signal for which the bit count for representing the input signal has been extended from the first bit count to the second bit count In addition, the change obtainment unit may be configured to initialize a value of the change signal to a value close to 0, at a changing point at which the input signal changes from monotonic increase to decrease or from monotonic decrease to increase.

With this, it is possible to prevent the direct current component from accumulating in the change signal, even when a digital signal having a waveform like a sawtooth wave is inputted. As such, a smoothing method that holds the direct current component is unnecessary, and thus the level of freedom is increased in that, for example, a method that generates harmonic waves can be utilized.

The change obtainment unit is configured to generate the change signal such that, for each of a changing point at which an absolute value of the change signal changes from monotonically increasing to decreasing and a changing point at which the absolute value of the change signal changes from monotonically decreasing to increasing, the absolute value of the change signal subsequent to the changing point changes with a greater width than the absolute value of the change signal prior to the changing point.

With this, even when a sawtooth-shaped signal is inputted, the value of the change signal can be made to approach 0 rapidly so that the direct current component does not accumulate in the change signal.

It should be noted that the implementation of the present invention is not limited to that of an audio signal processing apparatus having the above-described characteristics, and the same advantageous effects as in the above configuration are produced even when the present invention is implemented as a mobile phone including such an audio signal processing apparatus.

It should be noted that the present invention can be implemented, not only as an audio signal processing apparatus such as that described herein, but also as an audio signal processing method having, as steps, the characteristic units included in such an audio signal processing apparatus, or as a program causing a computer to execute such characteristic steps included in the audio signal processing method. In addition, it goes without saying that such a program can be distributed via a recording medium such as a CD-ROM (Compact Disc-Read Only Memory) and via a communication network such as the Internet.

With the above-described configuration, the audio signal processing apparatus according to the present invention fully extracts the minute signal and low-frequency signal that become difficult to recreate as a result of digitalization, and extends the quantization bit number, and thus minute signal recreatability is excellent, and, since the low-frequency gradation becomes clear, sound quality improves, and it becomes possible to provide natural reproduced sound that recreates the original analog signal.

Furthermore, with the above-described configuration, the audio signal processing apparatus according to the present invention can adjust the distribution of the amplitude value of the output signal of the amplitude change extractor, that is, the signal to be bit-extended, and thus, by adjusting according to the genre of music to be reproduced, the state of the digitalized data (particularly the amplitude change width of the data), and the subjective effect, the audio signal processing apparatus has a wide application range and can provide a natural reproduced sound that recreates the original analog signal.

FURTHER INFORMATION ABOUT TECHNICAL BACKGROUND TO THIS APPLICATION

The disclosure of Japanese Patent Application No. 2009-229429 filed on Oct. 1, 2009 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

(First Embodiment)

Hereinafter, an operation and respective constituent elements of an audio signal processing apparatus according to a first embodiment shall be described in detail.

Figure 1:
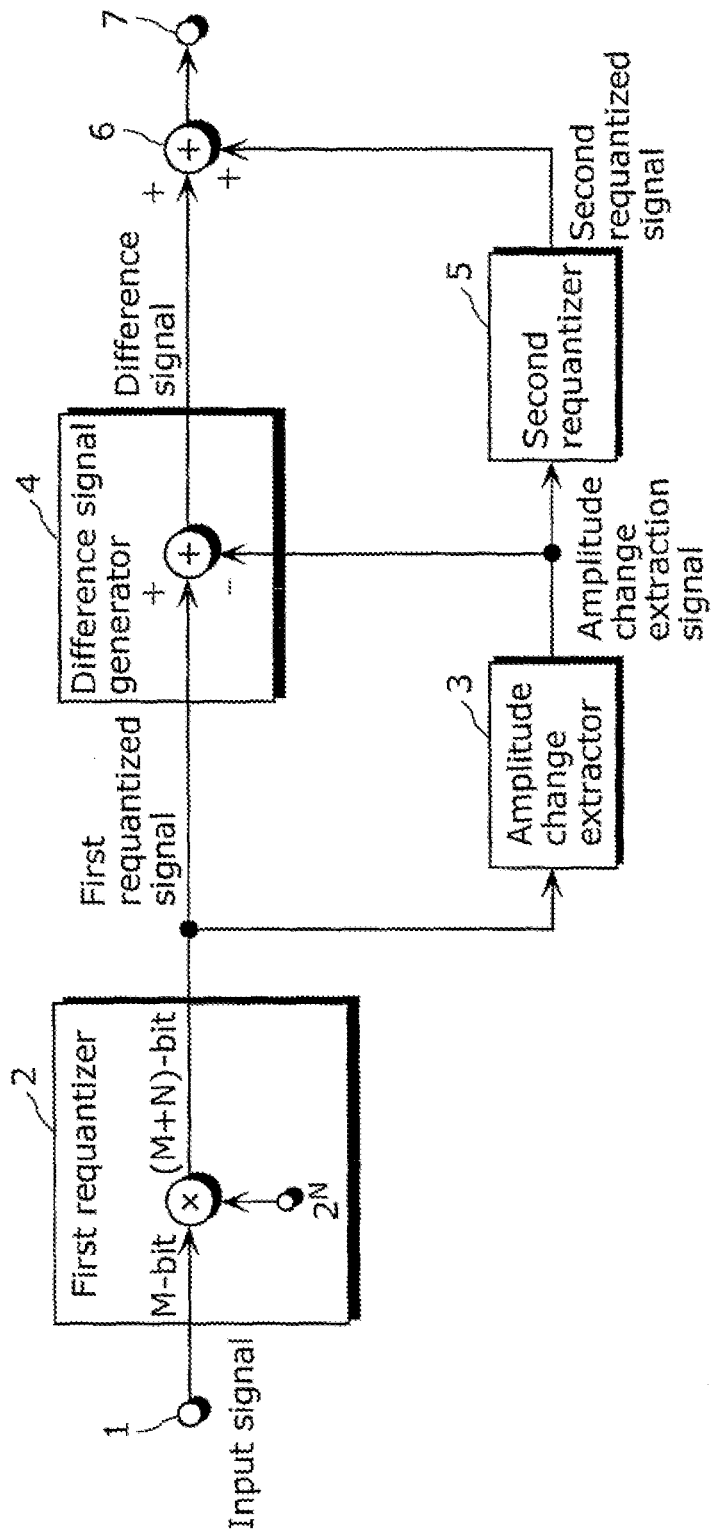
FIG. 1 is a block diagram showing a configuration of the audio signal processing apparatus according to the first embodiment.

FIG. 1 is a block diagram showing the configuration of the audio signal processing apparatus according to the first embodiment.

With digital audio data that is recorded and reproduced by converting an analog signal into a digital signal, the analog signal is quantized, and thus quantization noise (signal waveform deterioration) caused by the inability to quantize a signal that is below a quantization resolution capability is generated. In particular, a minute signal cannot be accurately quantized because the signal amplitude is small, and thus nuances such as intonations included in music are lost. Furthermore, it is likewise not possible to accurately quantize a low-frequency signal even when it is a signal having large amplitude, because the change in amplitude is small in terms of sampling interval. As such, low frequency gradation becomes unclear.

By extending an M-bit (M is a positive integer) digital signal by N bits (N is a positive integer) to convert the digital signal to an (M+N)-bit digital signal, the audio signal processing apparatus shown in FIG. 1 generates a digital signal that is closer to the original sound (analog signal) prior to conversion to the M-bit digital signal, and recreates sound quality that is closer to the original sound. Most of all, the audio signal processing apparatus accurately extracts the change portions of a minute signal and a low-frequency signal, and remedies the generated quantization noise (signal waveform deterioration) occurring in these signals.

In FIG. 1, the audio signal processing apparatus includes an input terminal 1, a first requantizer 2, an amplitude change extractor 3, a difference signal generator 4, a second requantizer 5, an adder 6, and an output terminal 7. The input terminal 1 receives an M-bit digital input signal. The first requantizer 2 bit-extends the M-bit digital Input signal to a (M+N)-bit first requantized signal. The amplitude change extractor 3 detects a change in the signal amplitude of the first requantized signal, and generates an amplitude change extraction signal. The difference signal generator 4 generates a difference signal which is the difference between the first requantized signal and the amplitude change extraction signal. The second requantizer 5 converts the amplitude change extraction signal to a (M+N)-bit second requantized signal. The adder 6 adds the difference signal and the second requantized signal. The output is terminal 7 outputs the output signal of the adder 6. It is to be noted that, in the present invention, "requantization" means resetting the Least Significant Bit (LSB) of the amplitude of a digital signal to a new bit width.

Figure 2:
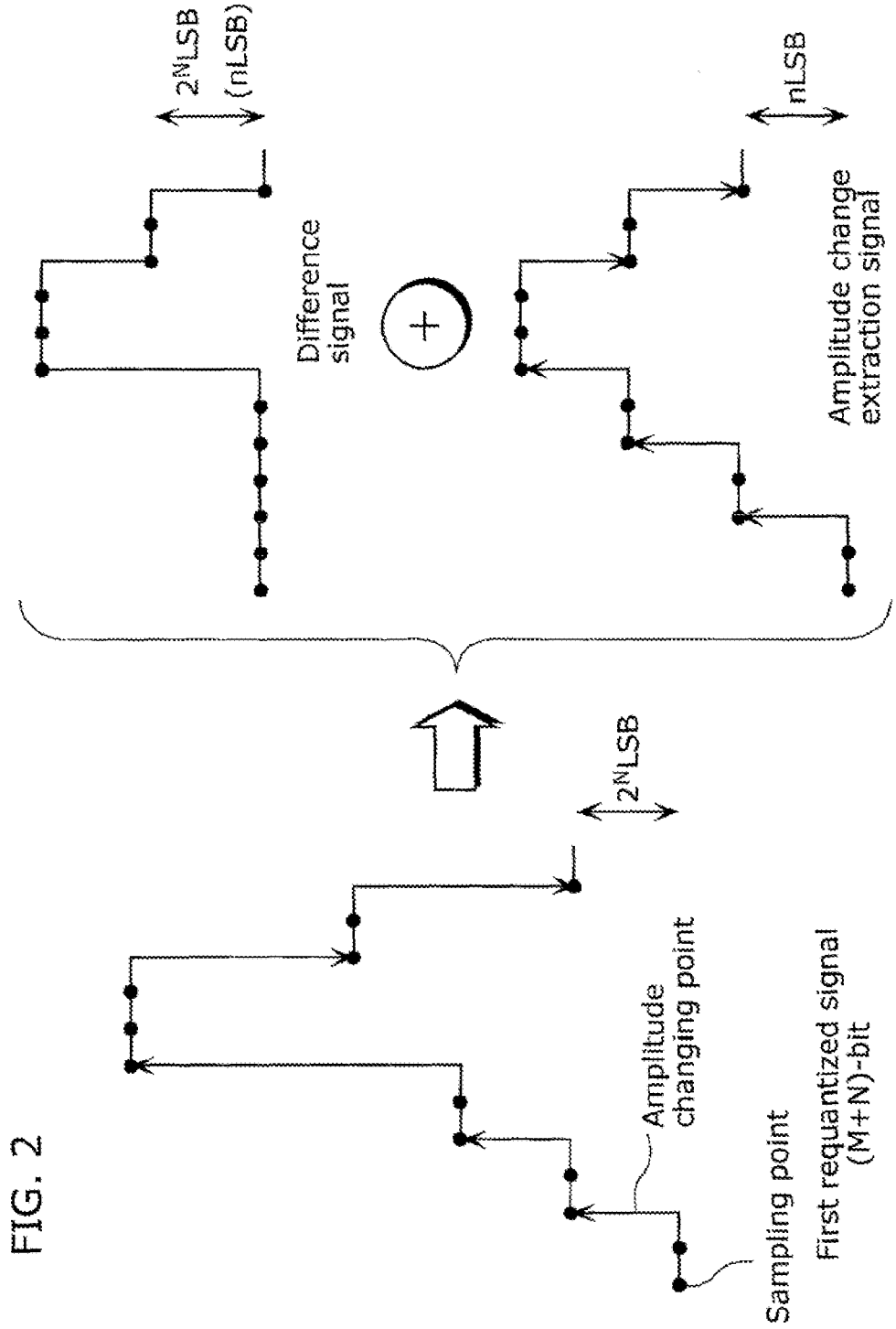
FIG. 2 is a diagram describing an operation of an amplitude change extractor and a difference signal generator according to the first embodiment.
Figure 3:
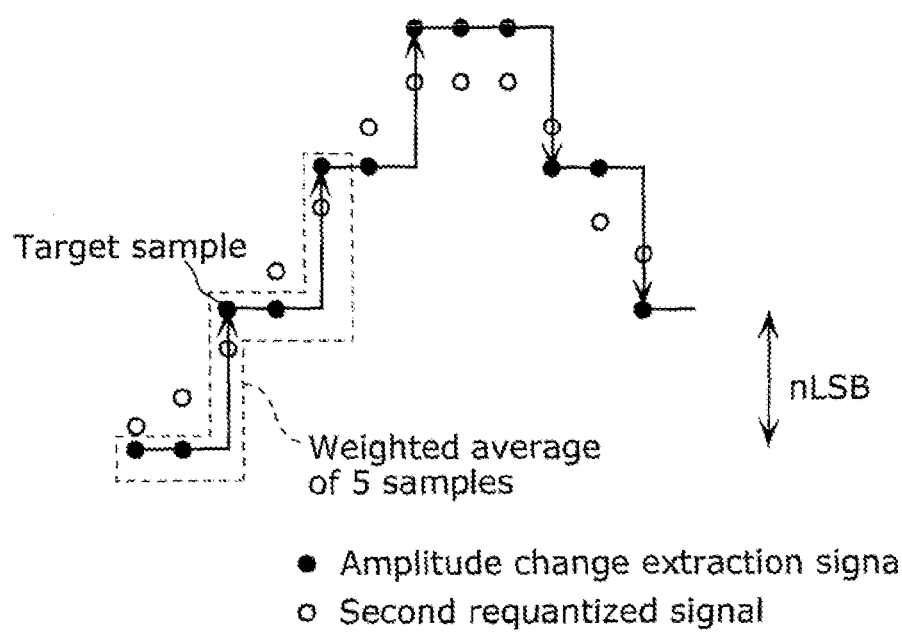
FIG. 3 is a diagram describing an operation of a second requantizer according to the first embodiment.

FIG. 2 is a diagram describing an operation of the amplitude change extractor 3 and the difference signal generator 4 in the audio signal processing apparatus according to the first embodiment. FIG. 3 is a diagram describing an operation of the second requantizer in the audio signal processing apparatus according to the first embodiment. The operation of the audio signal processing apparatus configured in the manner described above shall be described in detail.

An M-bit digital input signal is inputted from the input terminal 1. The first requantizer 2 bit-extends (requantizes) the M-bit input signal to the (M+N)-bit first requantized signal, by multiplying the M-bit input signal by $2^N$ (N is a positive integer). The amplitude change extractor 3 detects whether the amplitude of the current sample of the first requantized signal (1) changes in the positive direction, (2) does not change, or (3) changes in the negative direction, from the amplitude of the preceding sample. The amplitude change extractor 3 (1) adds an n-fold LSB value and outputs the resulting value in the case of a change in the positive direction, (2) adds 0 and outputs the resulting signal when there is no change, and (3) subtracts the n-fold LSB value in the case of a change in the negative direction. Here, n is a positive integer, LSB is the least significant bit represented in the quantization bit number (M+N) bit. Through the above-described processes (1), (2), and (3), an n-fold LSB value is added or subtracted depending on the direction of the amplitude change, regardless of the width of the input signal amplitude change. Normally, since n can be set to satisfy $n \leq 2^N$, a signal obtained by compressing the amplitude change of the first to requantized signal by the n-fold LSB value is outputted. By setting a fixed value for the amplitude change amount of the amplitude change extraction signal regardless of the change width of the first requantized signal, the change in a minute signal of a digital audio signal, which presents problems particularly in terms of waveform recreatability, can be extracted without being masked by a large amplitude signal. Furthermore, it becomes possible to extract a low-frequency signal as a signal having a large amplitude change.

Next, the difference signal generator 4 calculates and outputs the difference between the input signal and the output signal of the amplitude change extractor 3. This difference signal is treated as a signal that does not include conversion error.

FIG. 2 shows the operation of the above-described amplitude change extractor 3 and the difference signal generator 4. The amplitude change extractor 3 extracts the amplitude change of the first requantized signal, and generates a signal obtained by adding or subtracting the n-fold (in FIG. 2, $n=2^N$) LSB value, depending on such change. From FIG. 2, it can be seen that, regardless of the amplitude change of the first requantized signal, the amplitude value change of the amplitude change extraction signal is nLSB.

Next, the second requantizer 5 converts the amplitude change extraction signal to the (M+N)-bit second requantized signal. The second requantizer 5 requantizes, by (M+N) bits, the computation result of the weighted average of a predetermined number of sample data before and after a target sample to be processed.

Specifically, as shown in FIG. 3, the computation result of the weighted average of the data of five samples which include the target sample and samples before and after the target sample are requantized using a (M+N)-bit requantizer. Here, when the data of the five samples is assumed to be $\{a0, a1, a2, a3, a4\}$, the target sample a2 is converted to the calculation result of the weighted average $\{b0 \times a0 + b1 \times a1 + b2 \times a2 + b3 \times a3 + b4 \times a4\}/(b0+b1+b2+b3+b4)$. Here, $\{b0, b1, b2, b3, b4\}$ are arbitrary real number weighting coefficients, and are usually $\{1, 1, 1, 1, 1\}$ or $\{0.25, 0.5, 1, 0.5, 0.25\}$, and the like.

Subsequently, the difference signal and the second requantized signal are added-up by the adder 6, and outputted from the output terminal 7.

As described above, in the first embodiment, a signal having no quantization, noise (signal waveform deterioration) is recreated by generating a (M+N)-bit digital signal obtained by extending, by N-bits, the M-bit digital input signal inputted from the input terminal 1.

It should be noted that although the amplitude change extractor 3 detects the amplitude change of the first requantized signal in FIG. 1, it may detect the amplitude change of the input signal.

Furthermore, although it is assumed that $n=2^N$ in the preceding description, the value of n can be an arbitrary integer value equal to or greater than 1. Although a value within a range of $1 \leq n \leq 2^N$ is normally used, a value exceeding $2^N$ may be used depending on the music source. Even in such a case, a value of approximately $2^{2N}$ is the practical upper limit. Although the first requantized signal is separated into the output signal of the amplitude change extractor 3 and the output signal of the difference signal generator 4, the distribution of the input signal to both output signals can be changed by changing n. Specifically, as n increases, the amplitude of the output signal from the amplitude change extractor 3 becomes larger and the amplitude of the output signal from the difference signal generator 4 becomes smaller. An enlargement of the amplitude of the output signal from the amplitude change extractor 3 means that the percentage of the signal on which the bit-extension process by the second requantizer 5 is to be performed increases.

Although n is assumed to be a fixed value in the preceding description, the value may be adaptively changed depending on the amplitude change width of the input signal. Specifically, n may be set high (for example, $n>2^N$) for an input signal having a large amplitude change in each sample.

Figure 4:
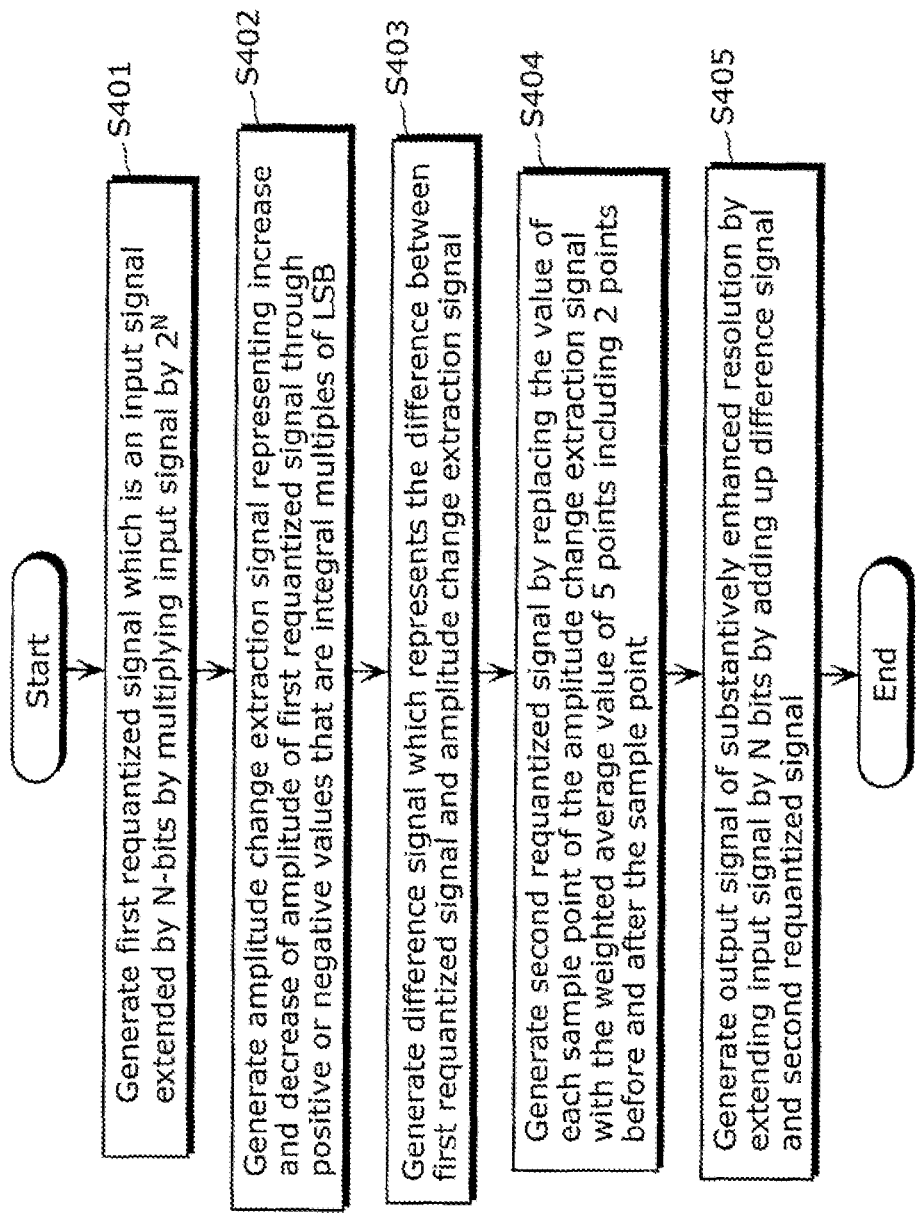
FIG. 4 is a flowchart showing an operation of the audio signal processing apparatus according to the first embodiment.

FIG. 4 is a flowchart showing the operation of the audio signal processing apparatus according to the first embodiment. As shown in the figure, by multiplying the input signal by $2^N$, the first requantizer 2 generates a first requantized signal obtained by extending the LSB of the input signal by N bits (S401). Next, the amplitude change extractor 3 generates an amplitude change extraction signal which represents the increase or decrease of the amplitude of the first requantized signal through a positive or negative LSB of a predetermined bit count (S402). In addition, the difference signal generator 4 generates a difference signal obtained by subtracting the amplitude change extraction signal generated by the amplitude change extractor 3 from the first requantized signal generated by the first requantizer 2 (S403). Furthermore, the second requantizer 5 interpolates the sample value of the amplitude change extraction signal and outputs the second requantized signal by replacing the value of each sample point of the amplitude change extraction signal with an average value obtained by calculating the weighted average of five points including the sample point and the two points before and after the sample point (S404). The adder 6 generates an output signal by adding the difference signal generated by the difference signal generator 4 and the second requantized signal generated by the second requantizer 5, and the generated output signal is outputted to the outside from the output terminal 7 (S405).

It should be noted that although, in the first embodiment, the amplitude change extractor 3 generates, for the first requantized signal that has been bit-extended by the first requantizer 2, an amplitude change extraction signal representing the change of the first requantized signal, the amplitude of the input signal prior to bit-extension may be monitored and the value of n may be changed according to the detected state thereof.

Figure 5:
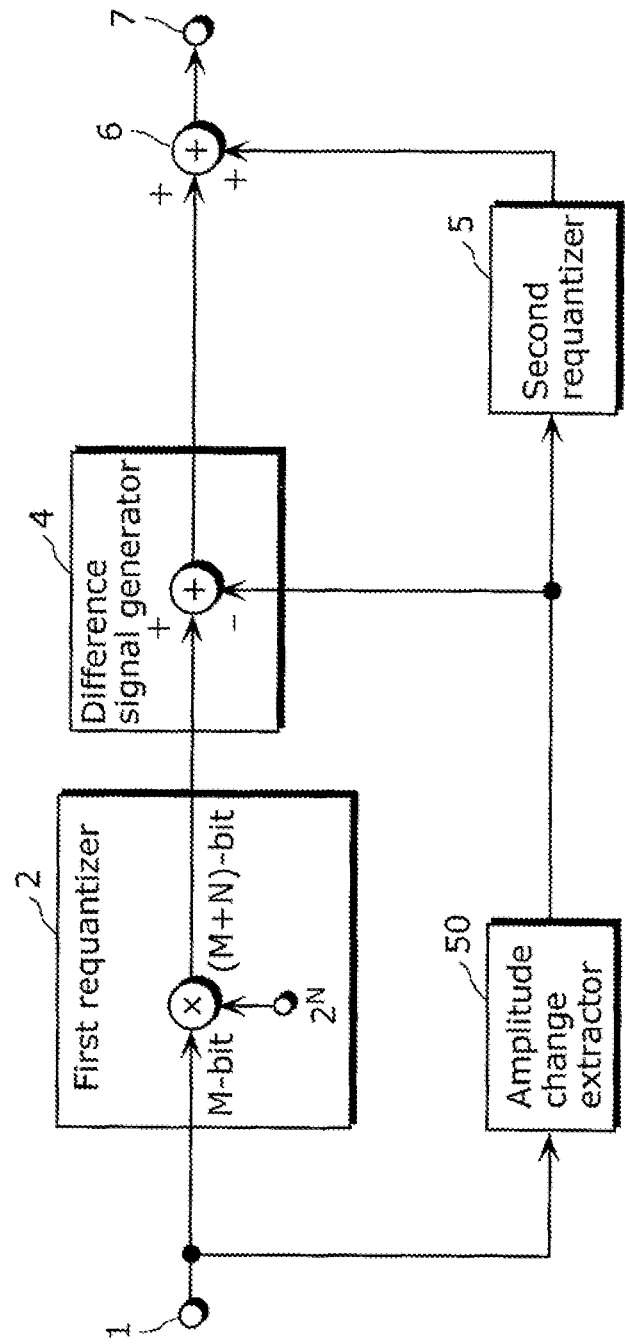
FIG. 5 is a block diagram showing another example of a configuration of the audio signal processing apparatus according to the first embodiment.

FIG. 5 is a block diagram showing another example configuration of the audio signal processing apparatus according to the first embodiment. In FIG. 5, an amplitude change extractor 50 receives an input signal that has branched off at a stage prior to the first requantizer 2, and generates, for the input signal prior to bit-extension, an amplitude change extraction signal representing the amplitude change thereof. Since the other processing units are the same as the respective constituent elements shown in FIG. 1, the same numerical references are assigned and their description shall be omitted.

It is to be noted that an instantaneous value of the amplitude (amplitude value per sample) of the input signal, a temporal average of the amplitude of the input signal in a predetermined time width, an output value obtained after performing a filtering process having predetermined frequency characteristics on the input signal, and so on, can be monitored as the value to be monitored by the amplitude change extractor 3.

Furthermore, the value of n indicating the degree of change of the amplitude change extraction signal may be adjusted depending on the music source to be reproduced by the audio signal processing apparatus according to the first embodiment, or while subjectively checking the sound quality of the sound reproduced by the audio signal processing apparatus according to the first embodiment.

(Second Embodiment)

Since the configuration of an audio signal processing apparatus according to a second embodiment is the same as the configuration of the audio signal processing apparatus according to the first embodiment with the exception of the second requantizer, overlapping description shall be omitted. Furthermore, since the basic signal flow in the audio signal processing apparatus according to the second embodiment is the same as that in the first embodiment, only the operation of the second requantizer, which is the different part, shall be described hereafter.

Figure 6:
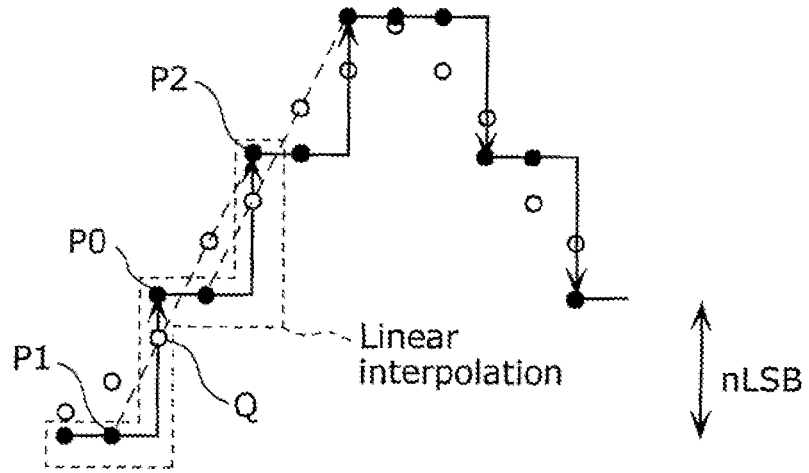
FIG. 6 is a diagram describing an operation of a second requantizer according to a second embodiment.

FIG. 6 is a diagram describing the operation of the second requantizer in the audio signal processing apparatus according to the second embodiment.

When a predetermined sample before and after a target sample in an inputted amplitude change extraction signal has a value that is different from the data of the target sample and such value monotonically increases or monotonically decreases, the second requantizer according to the second embodiment performs straight-line approximation for the line segment connecting such samples. In all other cases, the value of each target sample is calculated using the same weighted average as in the first embodiment.

In the case of FIG. 6, it is assumed that the target range of data to be used in processing are the five samples including the target sample and samples before and after the target sample. When (i) the samples in both the forward and backward directions among the predetermined number of samples before and after the target sample, each have a value different from the amplitude value of the target sample and (ii) such value monotonically increases or monotonically decreases, a value at a target sample time on the straight line connecting a sample P1 and a sample P2 is assumed as a processed target sample Q. Here, sample P1 is the first sample having a different amplitude value from the target sample out of the two samples that temporally precede the target sample (that is, the temporally preceding sample having the smaller time interval with the target sample). Sample P2 is the second sample having a different amplitude from the target sample out of the samples temporally subsequent to the target sample (that is, the temporally subsequent sample having the larger time interval with the target sample). Furthermore, when the respective samples of the two points before and after the target sample do not satisfy the above-described condition, the amplitude change extraction signal is interpolated using weighted average as shown in the first embodiment.

As described above, in the second embodiment, a signal having minimal quantization noise (signal waveform deterioration) is recreated by generating a $(M_+N)$-bit digital signal obtained by extending, by N-bits, the M-bit digital input signal inputted from the input terminal 1.

(Third Embodiment)

Figure 7:
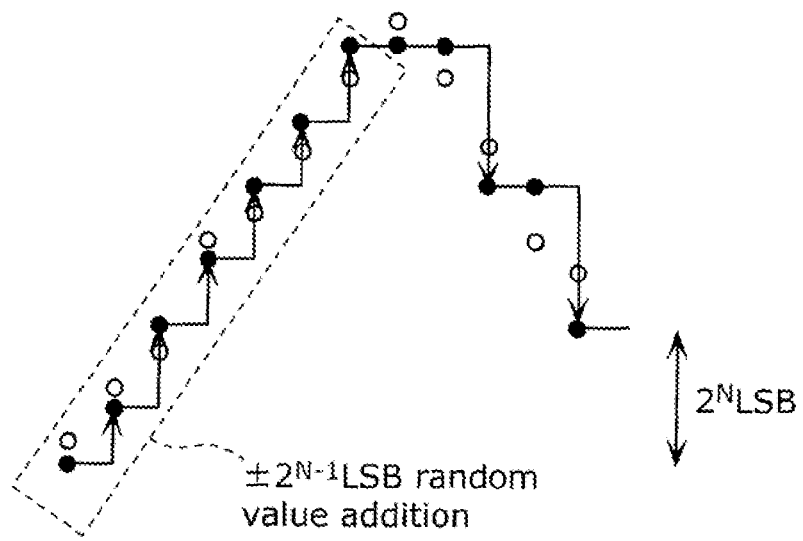
FIG. 7 is a diagram describing an operation of a second requantizer according to a third embodiment.

Since the configuration of an audio signal processing apparatus according to a third embodiment is the same as the configuration of the audio signal processing apparatus according to the first embodiment with the only point of difference being the processing performed by the second requantizer, description of processing units other than the second requantizer shall be omitted. FIG. 7 is a diagram describing the operation of the second requantizer in the audio signal processing apparatus according to the third embodiment.

Figure 8:
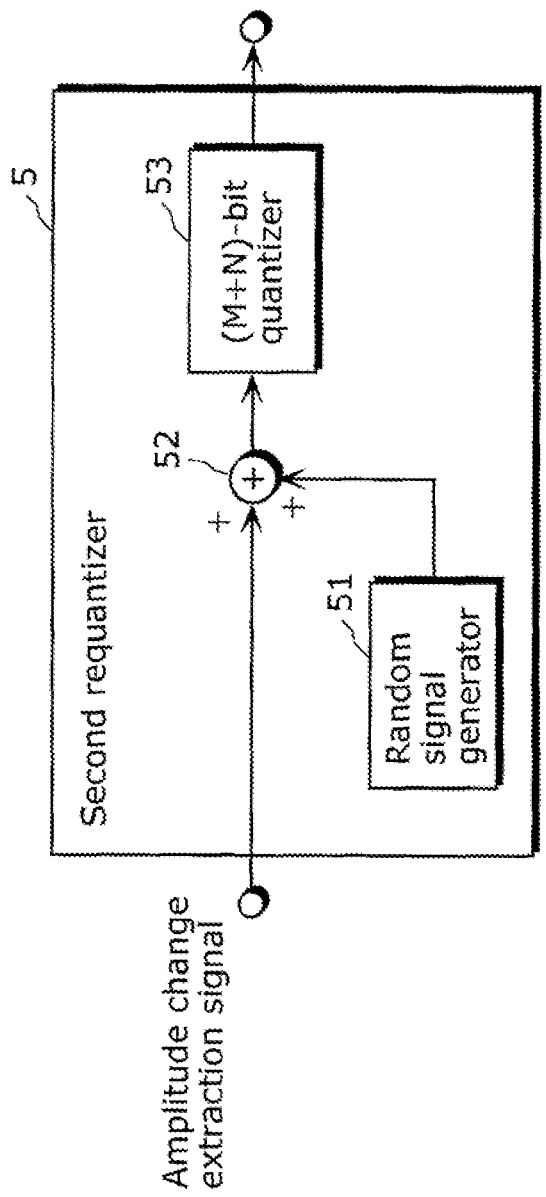
FIG. 8 is a block diagram showing a configuration of the second requantizer according to the third embodiment.
Figure 9:
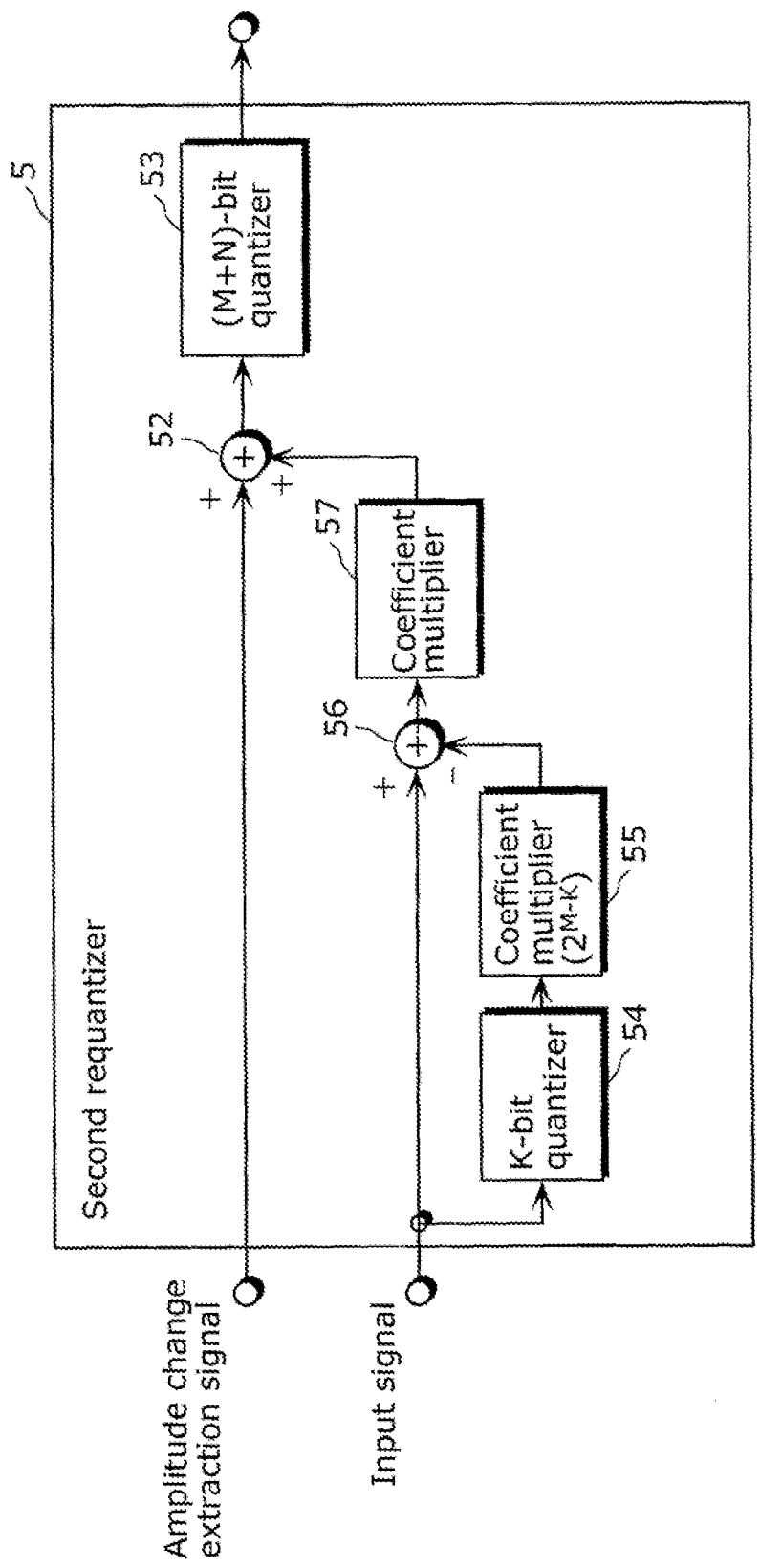
FIG. 9 is a block diagram showing detailed configuration of a random signal generator which generates a random value according to the value of an input signal, according to the third embodiment.

FIG. 8 is a block diagram showing the configuration of the second requantizer according to the third embodiment. FIG. 9 is a diagram showing the configuration of a random signal generator 51 which generates a random signal according to the sample value of an input signal.

Generally, the size of a quantization error caused by quantization is known to be within a range of ±0.5 of the quantization LSB. This is equivalent to a range of $\pm 2^{N-1}$ LSB when applied to the (M+N)-bit first requantized signal. Consequently, when there is a change in all of the data (amplitude) at least in the predetermined number of samples before and after the target sample (when each sample data monotonically increases or monotonically decreases), the second requantizer 5 generates the output signal by requantizing, by (M+N) bits, the result of adding data having an amplitude value within the range of $\pm 2^{N-1}$ LSB to each sample data.

In FIG. 7, data having an amplitude value within the range of $\pm 2^{N-1}$ LSB is added to a portion in which each sample data changes. Furthermore, in a range where each sample data does not change, bit extension may be performed according to the method described in the first embodiment or the second embodiment, or data having an amplitude value within the range of $\pm 2^{N-1}$ LSB may be added in the same manner as in a section where each sample data changes.

Next, the method of generating data having an amplitude value within the range of $\pm 2^{N-1}$ LSB shall be described with reference to FIG. 8. With the data having an amplitude value within the range of $\pm 2^{N-1}$ LSB that is to be added, it is assumed that such amplitude value changes randomly. Furthermore, as shown in FIG. 8, a second requantized signal is generated by way of (i) the random signal generator 51 generating a random signal having an amplitude that changes randomly at the same sampling cycle as the input signal, and controlling the random signal so that its amplitude value becomes $\pm 2^{N-1}$ LSB, (ii) an adder 52 adding the output signal of the random signal generator 51 to the amplitude change extraction signal, and (iii) a (M+N)-bit quantizer 53 quantizing the output signal of the adder 52.

In addition, a specific example of the random signal generator 51 shall be described using FIG. 9. As shown in FIG. 9, a random signal having an amplitude value within a range of $\pm 2^{N-1}$ LSB is generated by (i) quantizing, as an input signal, a digital input signal having an effective quantization bit number of M-bits using a K-bit quantizer 54 which quantizes to an effective quantization bit number of K bits (K is an integer satisfying K<M), (ii) multiplying the result by $2^{M-K}$ using a coefficient multiplier 55, (iii) generating the difference between the resulting output signal and the input signal using a subtractor 56, and (iv) normalizing the output signal of the subtractor 56, using a coefficient multiplier 57, to an amplitude value within the range of $\pm 2^{N-1}$ LSB. In this case, it is preferable that the value of K be, to some degree, close to M.

It should be noted that although, in the third embodiment, bit extension is performed in the second requantizer 5 by adding data having an amplitude value within the range of $\pm 2^{N-1}$ LSB and requantizing using a (M+N)-bit quantizer, bit extension may be performed by combining the respective processes of one or both of the first embodiment and the second embodiment with the process in the third embodiment.

(Fourth Embodiment)

Hereinafter, the operation and respective constituent elements of an audio signal processing apparatus according to a fourth embodiment shall be described in detail. In the fourth embodiment, the configuration of the audio signal processing apparatus, apart from the second requantizer, is the same as the configuration of the audio signal processing apparatus according to the first embodiment, and thus description shall be omitted.

Figure 10:
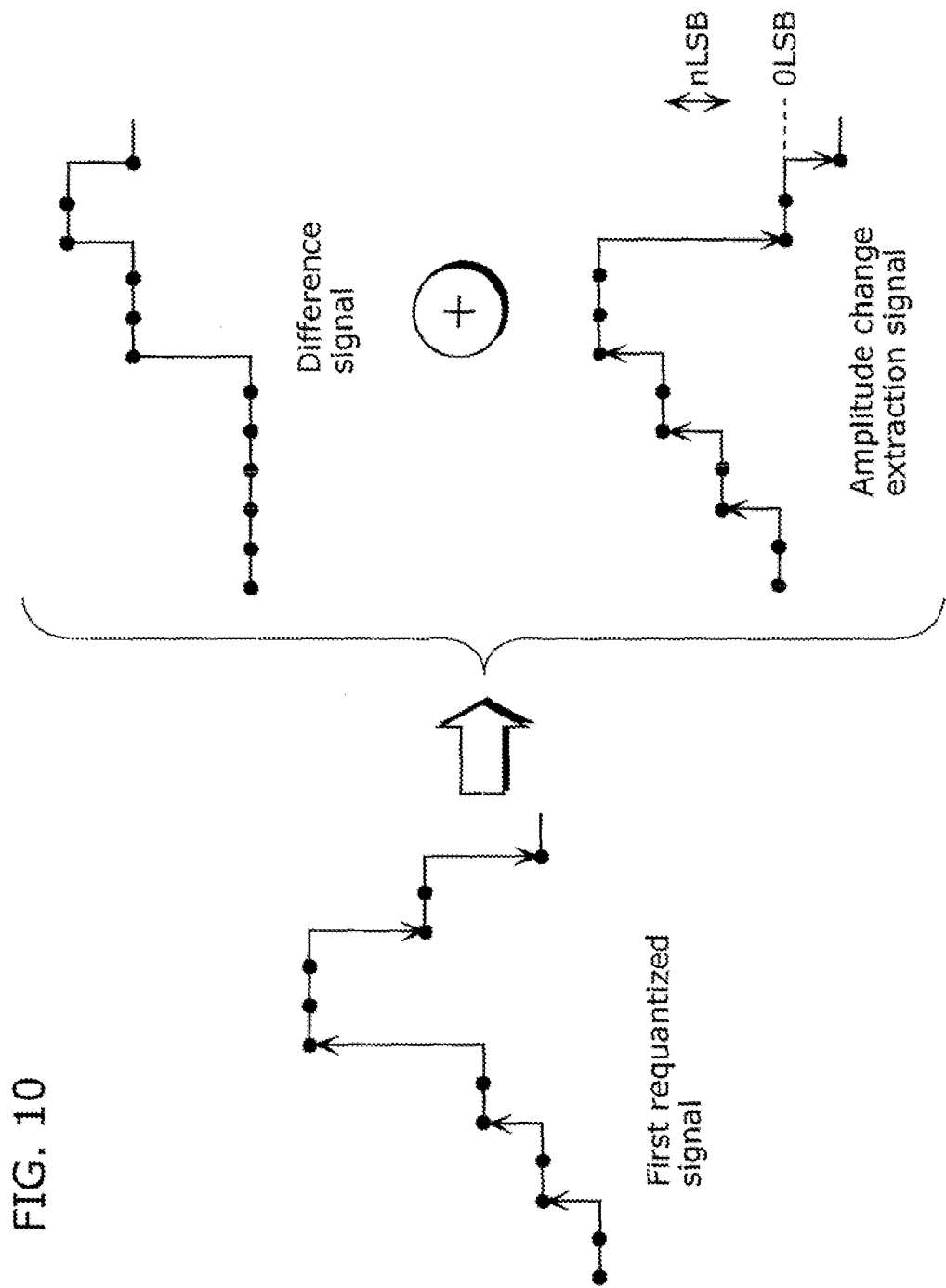
FIG. 10 is a diagram describing an operation of an amplitude change extractor and a difference signal generator according to a fourth embodiment.

FIG. 10 is a diagram describing the operation of the amplitude change extractor 3 and the difference signal generator 4 in the audio signal processing apparatus according to the fourth embodiment. In the case of the first embodiment, when a digital signal having a waveform like as a sawtooth wave is inputted, there are instances when direct current component is accumulated in the output signal of the amplitude change extractor 3. In order to prevent this, in the fourth embodiment, the output level of the amplitude change extractor 3 is mandatorily set to 0 at the point where the slope of the input signal changes from positive to negative, as shown in FIG. 10. The output level of the amplitude change extractor 3 is likewise mandatorily set to 0 at the point where the slope of the input signal changes from negative to positive. By doing so, the accumulation of the direct current component in the output signal of the amplitude change extractor 3 can be prevented.

Although, in the present embodiment, the output level of the amplitude change extractor 3 is mandatorily set to 0 when the slope of the input signal changes, instead of 0, a level having a value close to 0, such as +1 LSB, −1 LSB, and the like, is sufficient.

Furthermore, as another method, compared with the value of n when the output signal of the amplitude change extractor 3 moves away from 0, the value of n when the output signal approaches 0 may be increased. In addition, compared with the value of n when the absolute value of the amplitude change extraction signal moves away from 0, the value of n when the absolute value approaches 0 may be increased. Furthermore, when the value of the amplitude change extraction signal changes from increasing to decreasing, the change width nLSB after the changing point may be increased.

(Fifth Embodiment)

Hereinafter, the operation and respective constituent elements of an audio signal processing apparatus according to a fifth embodiment shall be described in detail. In the fifth embodiment, the configuration of the audio signal processing apparatus, apart from the second requantizer, is the same as the configuration of the audio signal processing apparatus according to the first embodiment, and thus description shall be omitted.

Figure 11:
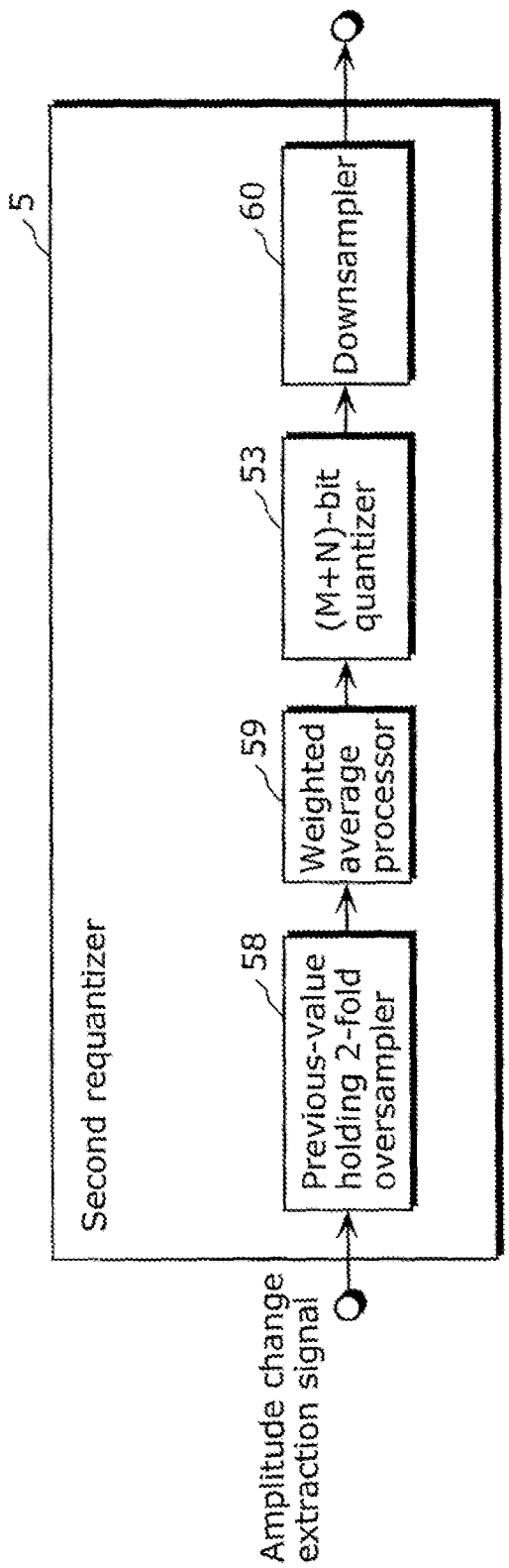
FIG. 11 is a block diagram showing a configuration of a second requantizer according to a fifth embodiment.
Figure 12:
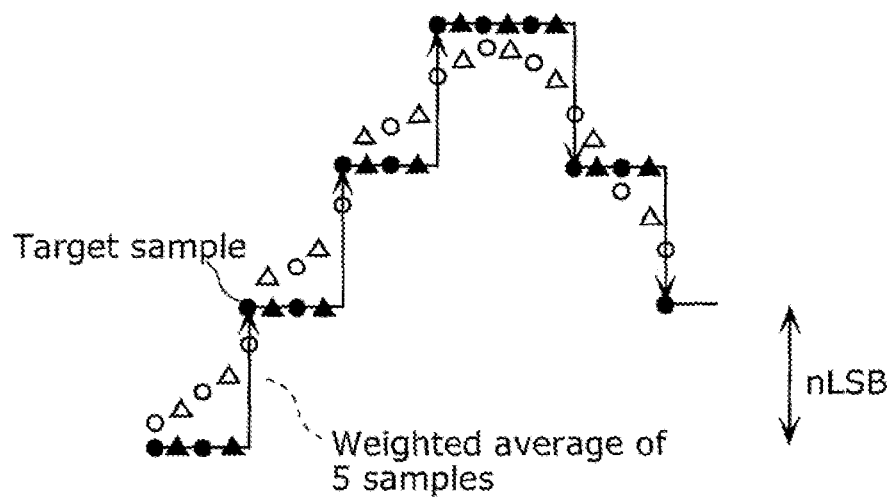
FIG. 12 is a diagram describing an operation of the second requantizer according to the fifth embodiment.
Figure 13:
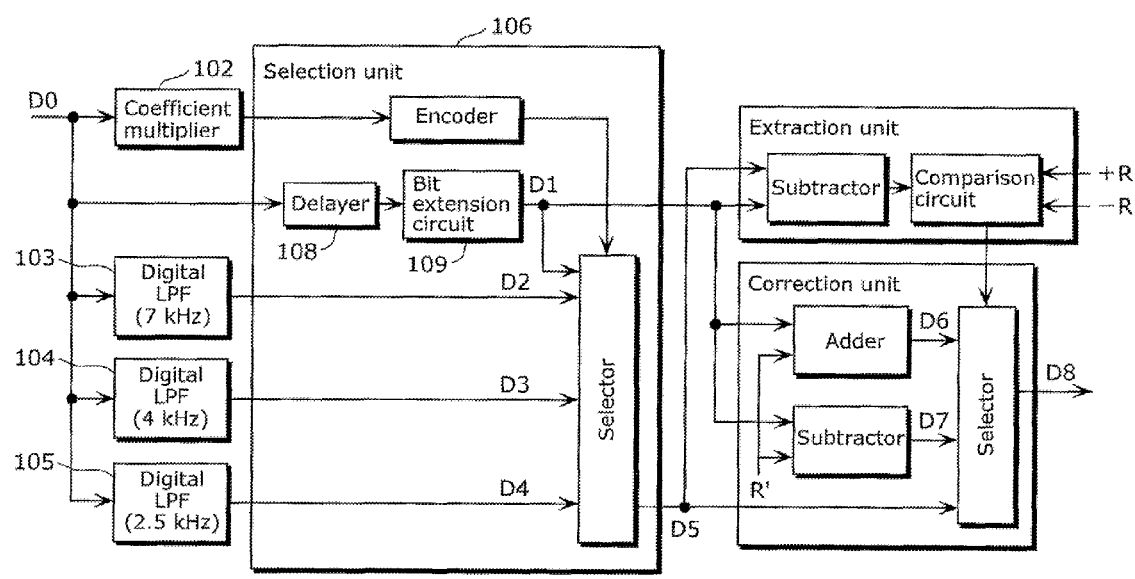
FIG. 13 is a block diagram showing the configuration of a conventional quantization distortion reducing apparatus.

FIG. 11 is a diagram showing a more detailed configuration of the second requantizer 5 in the audio signal processing apparatus according to the fifth embodiment. FIG. 12 is a diagram describing the operation of the second requantizer according to the fifth embodiment. As shown in FIG. 11, the second requantizer 5 includes a previous-value holding 2-fold oversampler 58, a weighted average processor 59, a (M+N)-bit quantizer 53, and a downsampler 60.

As shown in FIG. 12, with regard to the amplitude change extraction signal inputted to the second requantizer 5, the previous-value holding 2-fold oversampler 58 inserts, between samples of the input signal, a sample of a signal generated by holding a previous sample value of the input signal, thereby the second requantizer 5 generates a signal in which the sampling rate of the amplitude change extraction signal is doubled.

Next, the weighted average processor 59 performs the same weighted average processing as in the first embodiment on the 2-fold oversampled data, and the (M+N)-bit quantizer 53 requantizes, to (M+N) bits, the weighted average processing result.

Subsequently, the downsampler 60 extracts the processed data corresponding to the amplitude change extraction signal inputted to the second requantizer 5, and causes the processed data to be outputted at the original sampling rate. In this manner, smoother data is generated.

It should be noted that the order of the (M+N)-bit quantizer 53 and the downsampler 60 may be reversed.

Note that each function block in the block diagrams (FIGS. 1, 5, 8, 9, 11, and so on) is typically implemented as an LSI which is an integrated circuit. These functions blocks may be individually configured as single chips or may be configured so that a part or all of the function blocks are included in a single chip.

For example, function blocks other than a memory may be configured as a single chip.

Although an LSI is mentioned here, the integrated circuit can also be called an IC, a system LSI, a super LSI, and an ultra LSI, depending on differences in integration.

Furthermore, the method of circuit integration is not limited to LSIs, and implementation through a dedicated circuit or a general-purpose processor is also possible. A Field Programmable Gate Array (FPGA) which allows programming after LSI manufacturing or a reconfigurable processor which allows reconfiguration of the connections and settings of the circuit cells inside the LSI may also be used.

In addition, depending on the emergence of circuit integration technology that replaces LSI due to progress in semiconductor technology or other derivative technology, it is obvious that such technology may be used to integrate the function blocks. Possibilities in this regard include the application of biotechnology and the like.

Furthermore, from among the respective function blocks, a separate configuration may be adopted for the unit which stores data to be coded or decoded, without it being configured as a single chip.

(Description Of Terminology)

The "change obtainment unit configured to obtain a change signal which is a signal having an amplitude that changes at a fixed quantization width when an amplitude of the input signal temporally changes" corresponds to the amplitude change extractor 3, the part of the "quantization unit configured to extend, from the first bit count to a second bit count, a bit count for representing the change signal obtained by said change obtainment unit" corresponds to the first requantizer 2, the "difference signal obtainment unit configured to obtain a difference signal which is a signal represented using the second bit count and obtained by subtracting the change signal obtained by said change obtainment unit from the input signal" corresponds to the difference signal generator 4, the other part of the "quantization unit configured to . . . smooth the change signal by requantizing the change signal using a second quantization width that is less than a first quantization width used on the input signal" corresponds to the second requantizer 5, and the "generation unit configured to generate an output signal by adding the change signal smoothed by said quantization unit and the difference signal obtained by said difference signal obtainment unit" corresponds to the adder 6.

Furthermore, the "change signal" corresponds to the amplitude change extraction signal, the "difference signal" corresponds to the difference signal, the "change signal smoothed by said quantization unit" corresponds to the second requantized signal, and the "output signal" corresponds to the output signal of the adder 6.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Industrial Applicability

The present application can be applied to an audio signal processing apparatus that can, through extension and high-bit conversion of the bits of a digital signal, recreate minute signals lost during digitalization and execute reproduction that is closer to an original sound. With this, the present invention can realize improvements in the functions and performance of digital source reproduction devices and perform high-sound quality reproduction of abundant existing digital audio sources such as compact discs, and is thus particularly effective for stimulating and developing the digital audio market.

What is claimed is:

1. An audio signal processing apparatus that performs signal processing on an input signal which is a digital audio signal represented using a first bit count, said audio signal processing apparatus comprising:

a processor;

a change obtainment unit configured to obtain a change signal which is a signal having an amplitude that changes at a fixed quantization width when an amplitude of the input signal temporally changes;

a quantization unit configured to extend, from the first bit count to a second bit count, a bit count for representing the change signal obtained by said change obtainment unit, and to smooth the change signal by requantizing the change signal using a second quantization width that is less than a first quantization width used on the input signal;

a difference signal obtainment unit configured to obtain a difference signal which is a signal represented using the second bit count and obtained by subtracting the change signal obtained by said change obtainment unit from the input signal; and a generation unit configured to generate an output signal by adding the change signal smoothed by said quantization unit and the difference signal obtained by said difference signal obtainment unit, wherein said quantization unit is configured to smooth values of target samples of the change signal, using different smoothing methods for different parts of the change signal, and wherein said change obtainment unit is configured to generate the change signal such that, for each of a changing point at which an absolute value of the change signal changes from increasing to decreasing and a changing point at which the absolute value of the change signal changes from decreasing to increasing, the absolute value of the change signal subsequent to the changing point changes with a greater width than the absolute value of the change signal prior to the changing point.

2. An audio signal processing method executed by an audio signal processing apparatus that performs signal processing on an input signal which is a digital audio signal represented using a first bit count, said method comprising:

obtaining a change signal which is a signal having an amplitude that changes at a fixed quantization width when an amplitude of the input signal temporally changes;

extending, from the first bit count to a second bit count, a bit count for representing the change signal, and smoothing the change signal by requantizing the change signal using a second quantization width that is less than a first quantization width used on the input signal;

obtaining a difference signal which is a signal represented using the second bit count and obtained by subtracting the obtained change signal from the input signal; and generating an output signal by adding the smoothed change signal and the difference signal, wherein said extending further comprises smoothing values of target samples of the change signal, using different smoothing methods for different parts of the change signal, and wherein said obtaining further comprises generating the change signal such that, for each of a changing point at which an absolute value of the change signal changes from increasing to decreasing and a changing point at which the absolute value of the change signal changes from decreasing to increasing, the absolute value of the change signal subsequent to the changing point changes with a greater width than the absolute value of the change signal prior to the changing point.

* * * * *